(12) United States Patent
Kuo et al.

(10) Patent No.: US 7,330,355 B2
(45) Date of Patent: Feb. 12, 2008

(54) FIXED PILLAR WITH HEAT LOSS

(75) Inventors: Yi-Cheng Kuo, Hsin-Tien (TW); Chi-Chang Chang, Hsin-Tien (TW); Cheng-Ming Hsu, Hsin-Tien (TW)

(73) Assignee: Via Technologies Inc., Taipei County (TW)

( * ) Notice: Subject to any disclaimer, the term of this patent is extended or adjusted under 35 U.S.C. 154(b) by 345 days.

(21) Appl. No.: 11/105,495

(22) Filed: Apr. 14, 2005

(65) Prior Publication Data
US 2006/0215370 A1 Sep. 28, 2006

(30) Foreign Application Priority Data
Mar. 22, 2005 (TW) .............. 94108834 A

(51) Int. Cl.
*H05K 7/20* (2006.01)

(52) U.S. Cl. ............ 361/707; 165/80.2; 165/80.3; 165/165; 165/185; 29/282; 411/396; 411/397; 411/410; 411/432; 411/384; 24/453; 174/16.3; 81/124.3; 257/717

(58) Field of Classification Search .......... 361/707; 165/80.2, 80.3, 165, 185; 24/453; 81/124.3; 29/282; 411/397, 389, 432, 396, 410, 384; 257/717; 174/16.3
See application file for complete search history.

(56) References Cited

U.S. PATENT DOCUMENTS

| | | | |
|---|---|---|---|
| 3,182,114 A * | 5/1965 | Burgess et al. ............ 174/16.3 |
| 3,868,748 A * | 3/1975 | Kelly ........................ 24/115 M |
| 4,607,685 A * | 8/1986 | Mitchell, Jr. ................ 165/80.3 |
| 4,802,532 A * | 2/1989 | Dawes et al. ............... 165/80.3 |
| 5,154,719 A * | 10/1992 | Cotrel ........................ 606/73 |
| 5,261,912 A * | 11/1993 | Frigg ......................... 606/61 |
| 5,313,099 A * | 5/1994 | Tata et al. .................. 257/717 |
| 5,347,689 A * | 9/1994 | Georgopoulos et al. .. 24/136 R |
| 5,385,583 A * | 1/1995 | Cotrel ........................ 606/61 |
| 5,499,892 A * | 3/1996 | Reed ............................ 411/5 |
| 5,603,374 A * | 2/1997 | Wu ............................ 165/80.3 |
| 5,643,260 A * | 7/1997 | Doherty ...................... 606/61 |
| 5,732,989 A * | 3/1998 | Stevenson et al. .......... 292/327 |
| 5,961,266 A * | 10/1999 | Tseng ......................... 411/383 |
| 6,014,315 A * | 1/2000 | McCullough et al. ....... 361/704 |
| 6,075,699 A * | 6/2000 | Rife ........................... 361/704 |
| 6,102,913 A * | 8/2000 | Jackson ....................... 606/61 |
| 6,141,214 A * | 10/2000 | Ahn ............................ 361/687 |
| 6,304,451 B1 * | 10/2001 | Rife ............................ 361/704 |
| 6,449,155 B1 * | 9/2002 | Colbert et al. .............. 361/704 |
| 6,454,772 B1 * | 9/2002 | Jackson ....................... 606/73 |
| 7,165,925 B2 * | 1/2007 | Unsworth et al. .......... 411/324 |

\* cited by examiner

*Primary Examiner*—Boris Chervinsky
*Assistant Examiner*—Courtney Smith
(74) *Attorney, Agent, or Firm*—Rosenberg, Klein & Lee

(57) ABSTRACT

A fixed pillar with heat loss is a fixed pillar for losing heat. The fixed pillar with heat loss includes a metal body, a screw thread and a plurality of grooves. The metal body is a hollow body. The plurality of grooves is respectively set on two sides of the metal body and communicating with each other. The screw thread is set on one end of the metal body to fix a circuit or other electric devices. Air flows into one side of the metal body and then passes through the inner part of the metal body and last flow out from another side of the metal body. Accordingly, the metal body exchanges heat with the air to lose the thermal energy quickly.

9 Claims, 8 Drawing Sheets

FIXED PILLAR WITH HEAT LOSS

FIELD OF THE INVENTION

The present invention relates to a fixed pillar with heat loss and, more particularly, to a fixed pillar with heat loss having a thermal loss function. The fixed pillar with heat loss can increase the thermal loss efficiency.

BACKGROUND OF THE INVENTION

As the technology is more and more improved, the function of the computer system must be formidable and comprehensive so the speed of the central processing unit (CPU) and chip systems must be increased substantially. Following above description, the CPU and chip systems will produce high thermal energy. The thermal energy is lost or transmitted by heat loss devices: for instance, fans or heat loss fins are set near the CPU and chip systems. The heat loss devices can't lose and transmit the heat of CPU and chip systems completely so a part of thermal energy will transmit to a circuit board. The part of thermal energy will transmit to a fixed pillar, which is immobile on the circuit board. The fixed pillar exchange heat with the air for losing the part of thermal energy.

Please see the FIG. 1. In the prior art, a fixed pillar comprises a metal body 10, which is a solidity body. One end of the metal body 10 have a spiral pillar 15, which is fixed on a computer shell. When the heat of circuit board transmits to the fixed pillar, the metal body 10 can exchange heat with the air by touching of the metal body 10 and the air. Because the metal body 10 is a solidity body, a part of the thermal energy will transmit to the internal part of the metal body 10 and not transmit to the surface of the metal body 10 quickly. Accordingly, heat loss efficiency is not good to lose the thermal energy of the circuit board. If the thermal energy is too large, it will damage electric elements of the circuit board, and furthermore it will reduce the usage life of the circuit board.

Accordingly, the present invention provides a fixed pillar with heat loss. It not only has the fixed function, but also reduces thermal energy quickly to elongate the usage life of the circuit elements. It can solve the questions of the prior art.

SUMMARY OF THE INVENTION

The primary object of the present invention is to provide a fixed pillar with heat loss, which is a metal body. An air can flow into the internal part of the metal body and through out to increase the heat loss efficiency by exchanging the thermal energy of the fixed pillar.

The fixed pillar with heat loss is a fixed pillar and it can lose the heat. The pillar with heat loss comprises a metal body, which is a hollow metal body. One end of the metal body has a screw thread for fixing to a circuit board or other electric devices. Two sides of the metal body have a plurality of grooves, which communicate with each other so two edges of the metal body can communicate with each other. The air can pass through the metal body and exchange heat with the metal body. Accordingly, increasing the heat loss efficiency of the fixed pillar and reducing the thermal energy quickly.

In the present invention, the characteristics and functions of the structure will be more readily understood from the following better embodiments and detailed descriptions when read in conjunction with the appended drawing, in which:

DETAILED DESCRIPTION OF THE PREFERRED EMBODIMENTS

Figure 1:
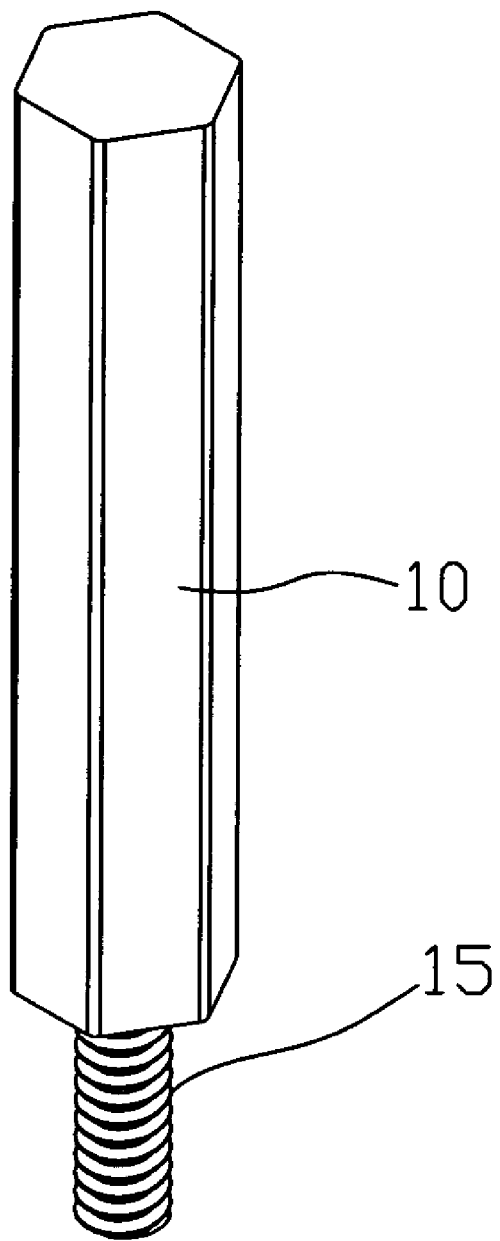
FIG. 1 is a side view of the fixed pillar in the prior art.
Figure 2:
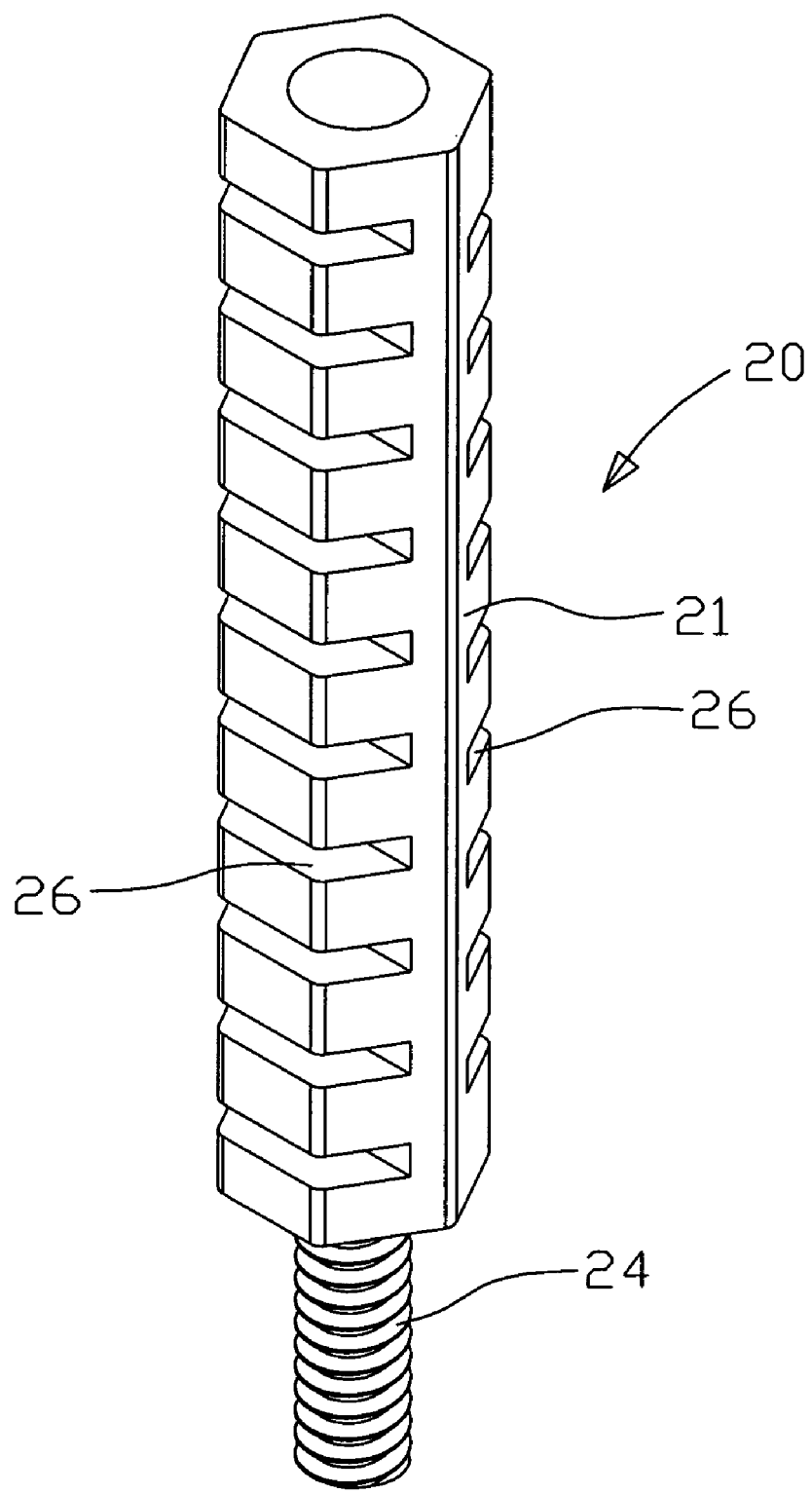
FIG. 2 is a side view of the first embodiment in the present invention.
Figure 3:
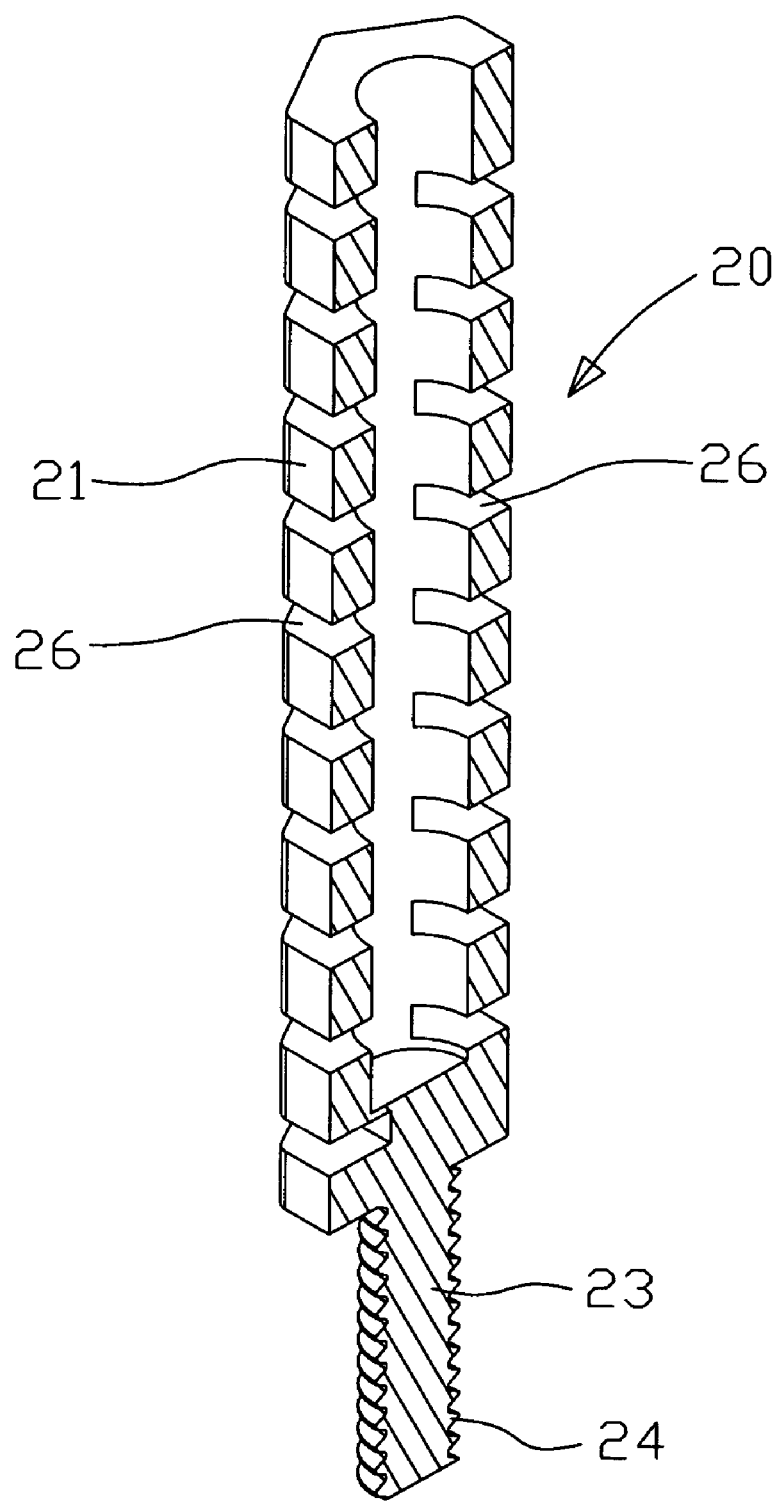
FIG. 3 is a cross-section view of the first embodiment in the present invention.

Please see the FIGS. 2 and 3, which respectively is side view and cross-section view of the first embodiment in the present invention. According to above two figures, a fixed pillar with heat loss 20 comprises a metal body 21, which is a polygon pillar. A spiral pillar 23 is connected with one end of the metal body 21 and the spiral pillar 23 has a screw thread 24 being fixed to a circuit board or other electric devices. The metal body 21 also can't need the spiral 23 and a surface of the one end of the metal body 21 has the screw thread 24. The metal body 21 is a hollow body and two sides of it have a plurality of grooves 26 communicating with each other. An air can flow into the groove 26 of one side of the metal body 21 and then pass through the inner part of the metal body 21 and last flow out from the groove 26 of another side of the metal body 21. Accordingly, the heat loss efficiency of the fixed pillar with heat loss 20 will be increase. Furthermore, the grooves 26 can increase the heat loss area of the metal body 21.

Figure 4A:
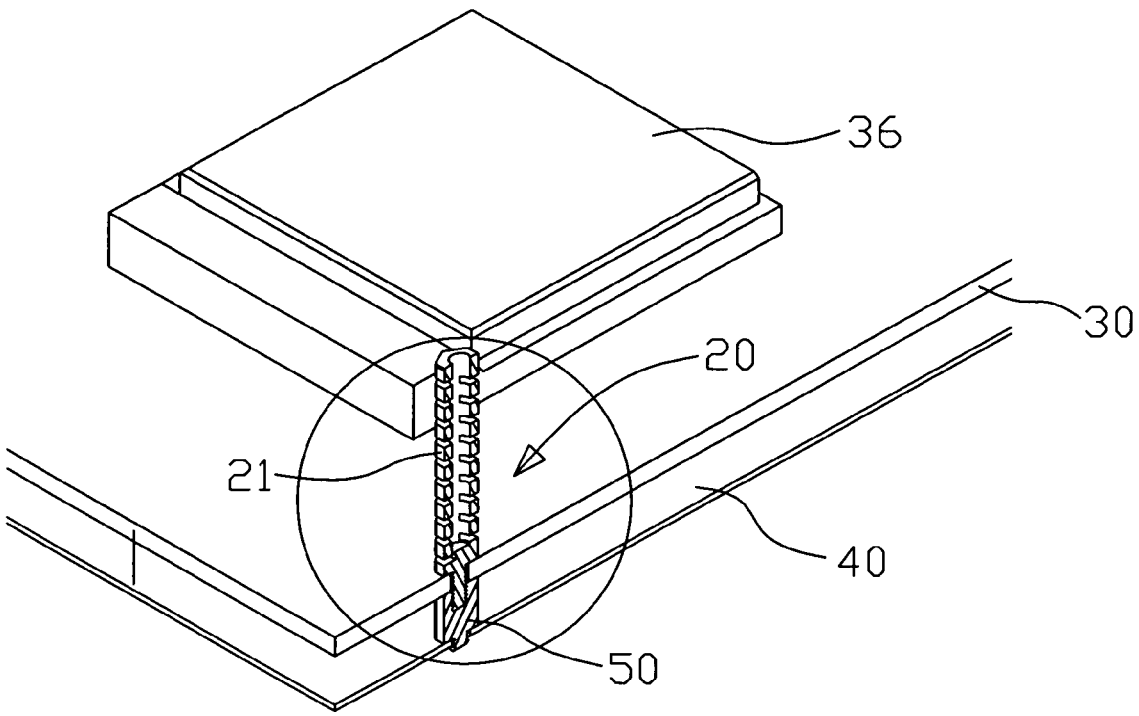
FIG. 4A is a assembly view of the first embodiment connected with the circuit board and computer shell in the present invention.
Figure 4B:
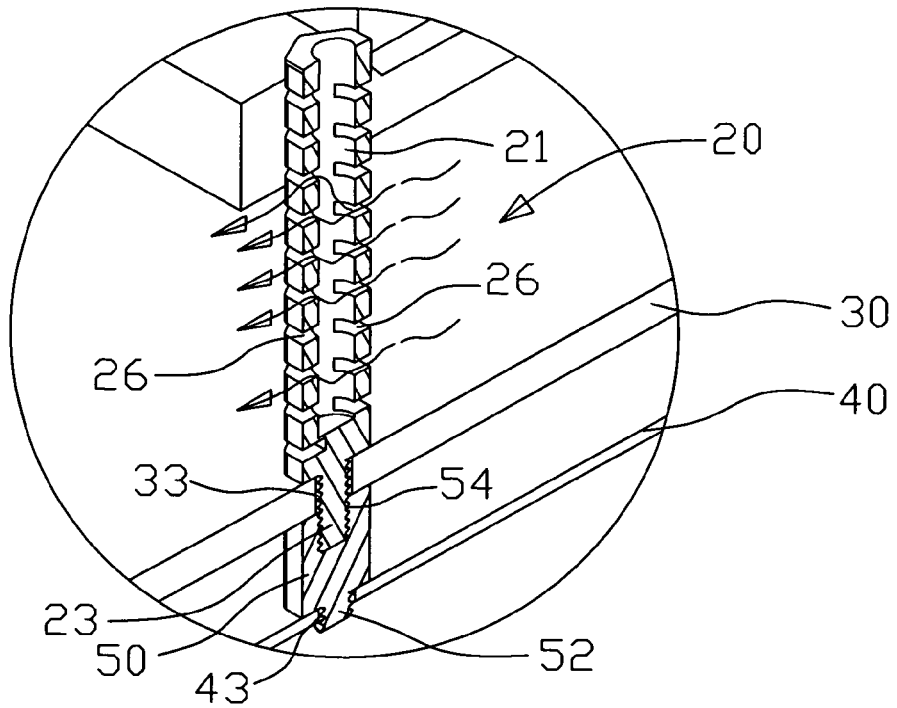
FIG. 4B is a magnified portion view of the FIG. 4A.

Please see the FIGS. 4A and 4B. The FIG. 4A is a assembly view of the first embodiment connected with a circuit board and computer shell in the present invention and FIG. 4B is a magnified portion view of the FIG. 4A. When a circuit board 30 is set on a computer shell 40, one end of a fixed position pillar 50 is connected with the computer shell 40 to put the circuit board 30 for lifting and orientating the circuit board 30. The one end of the fixed position pillar 50 has a spiral pillar 52 and the computer shell 40 has an inner screw thread hole 43 meshing with the spiral pillar 52. The fixed pillar with heat loss 20 of the present invention has a spiral pillar 23 and the circuit board 30 has an inner screw thread hole 33 and then the spiral pillar 23 match through the inner screw thread hole 33 to match an inner screw thread hole 54 of the fixed position pillar 50 for fixing the circuit board 30 to the computer shell 40.

A CPU 36 or a system chip is set on the circuit board 30. The CPU 36 or system chip produces the thermal energy, which will transmit to the metal body 21 according to the FIG. 4B. An air can flow into the one side of the grooves 26 of the metal body 21 and then pass through the inner part of the metal body 21 and last flow out from another side of grooves 26 of the metal body 21. Accordingly, the air exchange thermal energy with the metal body 21 to lose the heat, so as to reduce the thermal energy of the circuit board 30 and not damage the electric elements. So the fixed pillar with heat loss of the present invention will elongate the usage life of the circuit board 30 and it can fix to other electric devices, which are like heat loss fan and heat loss fins.

Figure 5A:
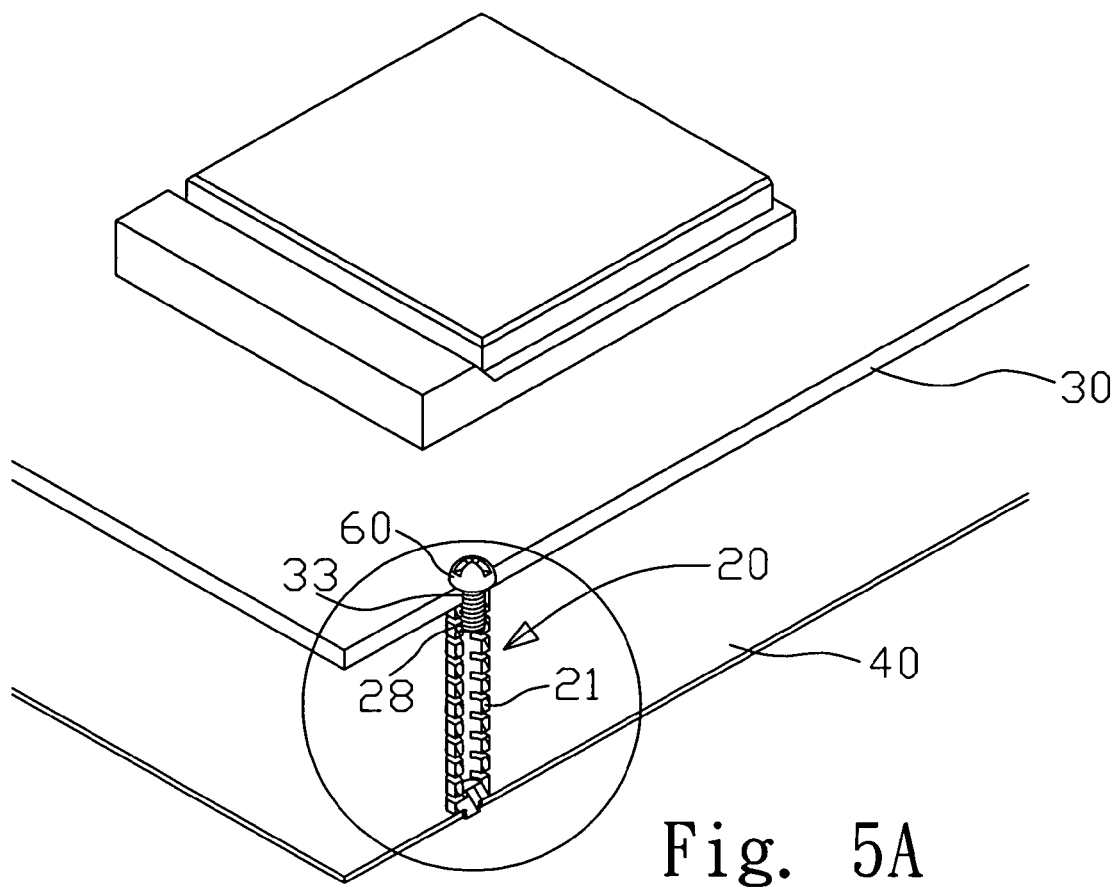
FIG. 5A is a assembly view according to the second embodiment connected with the circuit board and computer shell in the present invention.
Figure 5B:
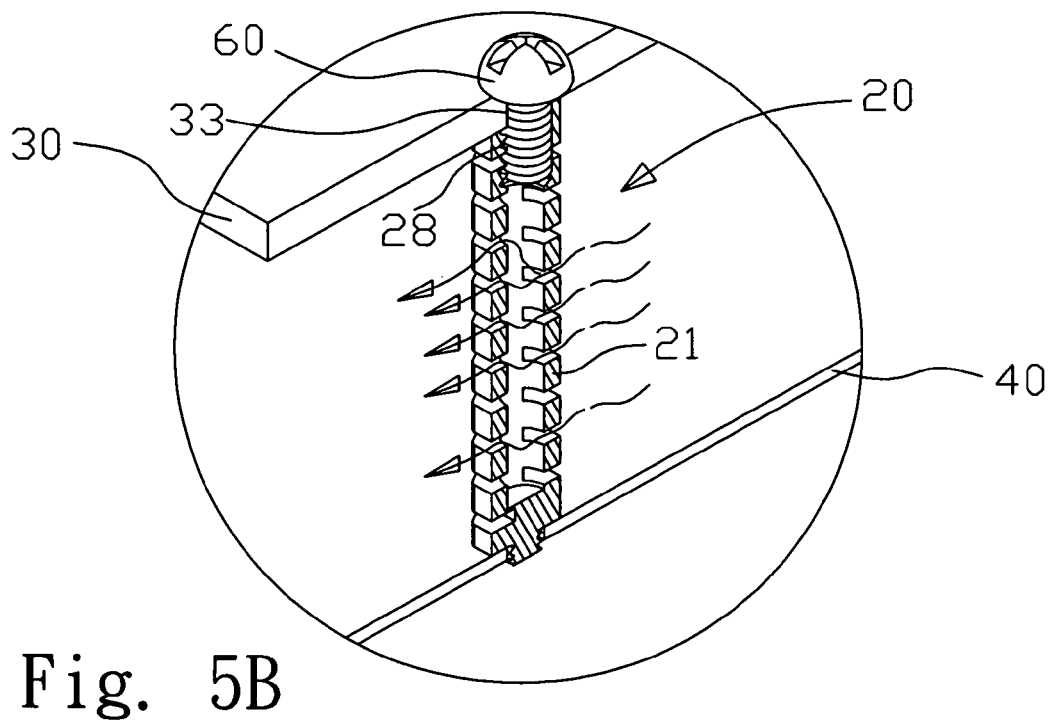
FIG. 5B is a magnified portion view of the FIG. 5A.

Please see the FIGS. 5A and 5B. The FIG. 5A is a assembly view of the second embodiment connected with the circuit board and computer shell in the present invention and FIG. 5B is a magnified portion view of the FIG. 5A. The second embodiment is different from the first embodiment. In the second embodiment, the metal body 21 further comprises an inner screw thread 28, which can instead of the fixed position pillar 50 in the first embodiment. The fixed pillar with heat loss 20 fix to the computer shell 40 and the circuit board 30 fix to the fixed pillar with heat loss 20 by a screw 60. The screw 60 passes through the inner screw thread hole 33 of the circuit board 30 and then fixes to the inner screw thread hole 28 of the fixed pillar with heat loss 20. According to above descriptions, the circuit board 30 is fixed to the computer 40 and the circuit board 30 can lose the thermal energy quickly.

Figure 6A:
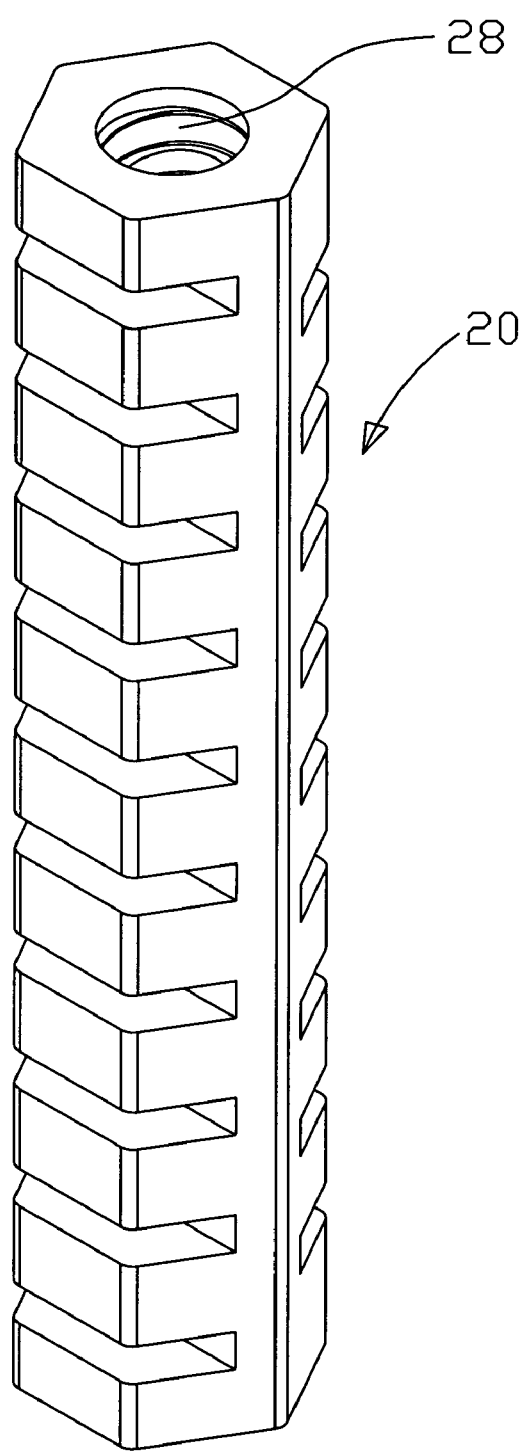
FIG. 6A is a side view of the third embodiment in the present invention.
Figure 6B:
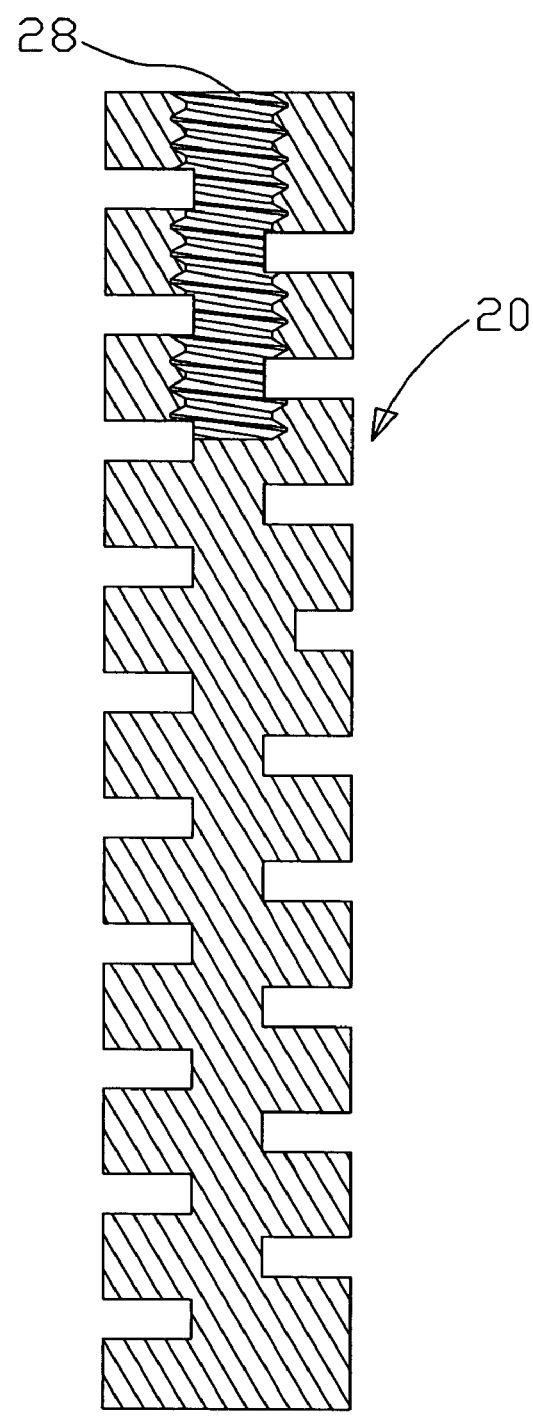
FIG. 6B is a cross-section view of third embodiment in the present invention.
Figure 7:
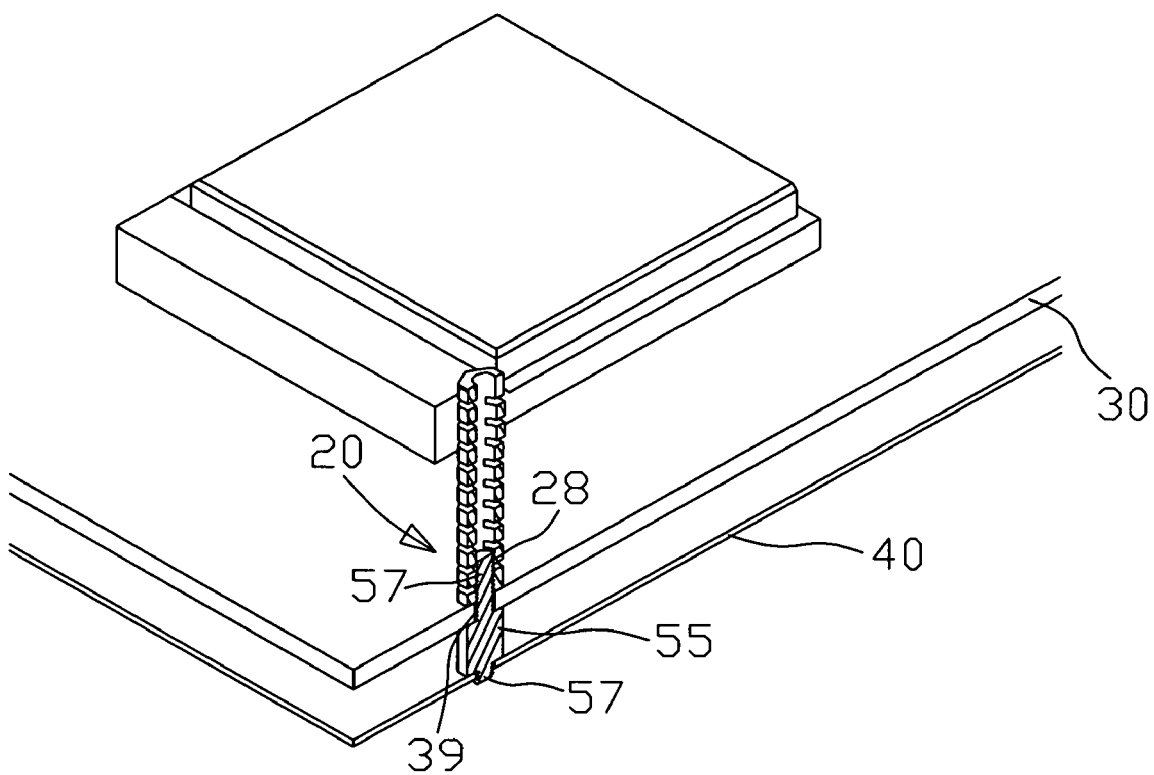
FIG. 7 is a assembly view of the third embodiment connected with the circuit board and computer shell in the present invention.

Please see the FIGS. 6A and 6B, which respectively is a side view and cross-section view of third embodiment in the present invention. The third embodiment is different from the above embodiments. The fixed pillar with heat loss 20 has no the outer screw thread 24 but has the inner screw thread hole 28. When use the fixed pillar with heat loss 20, it can match with a fixed pillar 55 of the FIG. 7, which has two ends, which respectively has a spiral pillar 57. One spiral pillar 57 is fixed to the computer shell 40. Another spiral pillar 57 penetrates through a through hole 39 of the circuit board 30 and then the spiral pillar 57 matches with the inner screw thread hole 28. Accordingly, the circuit board 30 is fixed to the computer 40.

Figure 8:
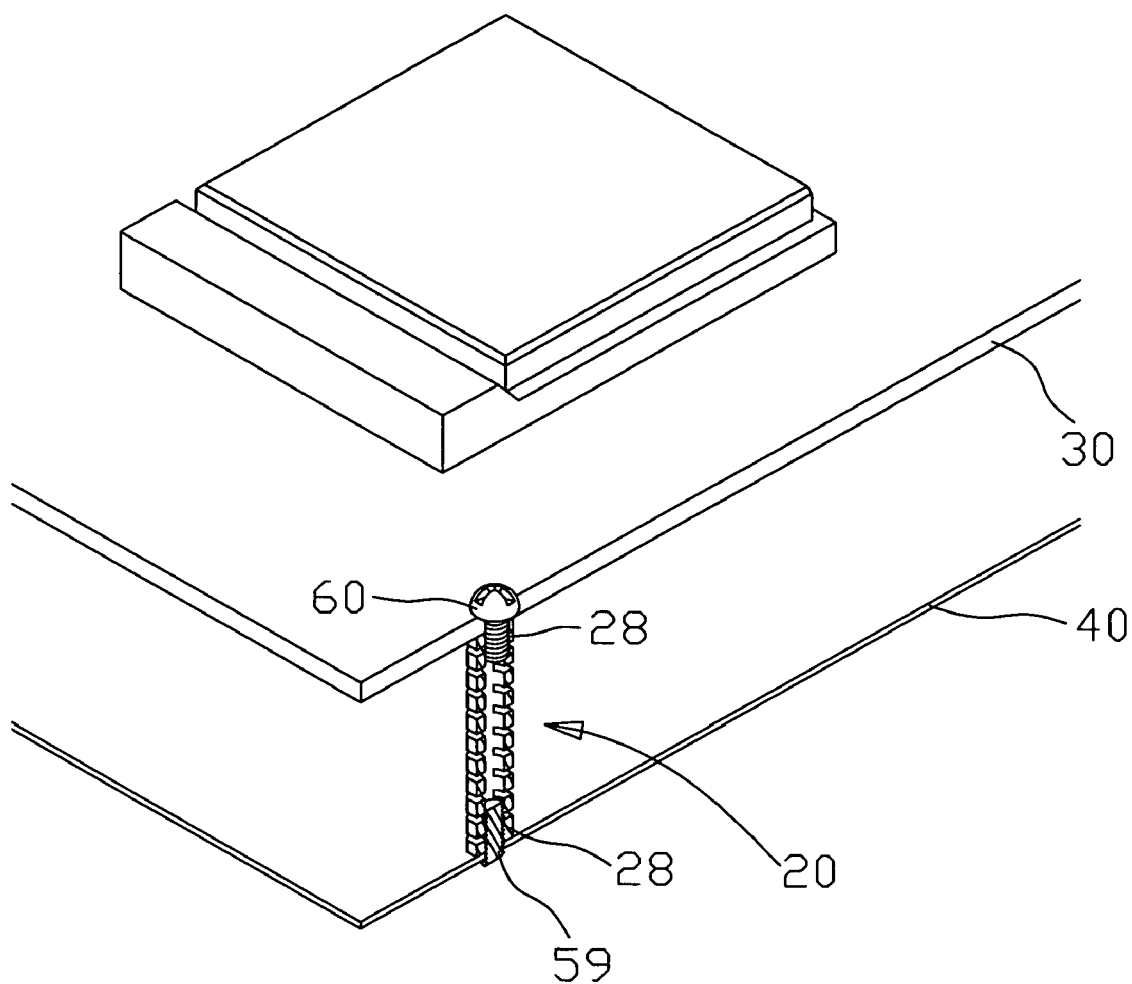
FIG. 8 is assembly view of the fourth embodiment connected with the circuit board and computer shell in the present invention.

Please see the FIG. 8, which is an assembly view of the fourth embodiment connected with the circuit board and computer shell in the present invention. The fixed pillar with heat loss 20 has two ends, which respectively has an inner screw thread hole 28. A spiral pillar 59 is fixed to the computer shell 40 so the fixed pillar with heat loss 20 become a fixed pillar, which is fixed to the spiral pillar 59. The fixed pillar with heat loss 20 is fixed to the circuit board 30 by a screw 60 and then the circuit board 30 is fixed to the computer shell 40.

According to above mentions, the fixed pillar with heat loss of the present invention comprises a hollow metal body, which has two ends. A screw thread is posited on the one end of the metal body to fix the circuit board or other electric devices. Two sides of the metal body respectively has a plurality of grooves, which communicate with each other. An air can flow into the one side of grooves and then pass through the metal body to exchange heat with thereof. The present invention can lose thermal energy of the circuit board or electric devices and increase the usage life of them.

Although the present invention has been described with reference to the preferred embodiment thereof, it will be understood that the invention is not limited to the details thereof. Various substitutions and modifications have been suggested in the foregoing description, and other will occur to those of ordinary skill in the art. Therefore, all such substitutions and modifications are intended to be embrace within the scope of the invention as defined in the appended claims.

We claim:

1. A fixed pillar with heat loss comprising:
    a metal body extending in a longitudinal direction, the metal body being a hollow body and an end of the metal body having an outer screw thread; and
    a plurality of grooves respectively being formed within two sides of the metal body for passage of air in a transverse direction, the air in fluid communication with respective grooves formed within the metal body to cool an electrical device attached to at least one end of the metal body.

2. The fixed pillar with heat loss as claimed in claim 1, wherein the metal body is a pillar.

3. The fixed pillar with heat loss as claimed in claim 2, wherein the pillar is a polygon pillar.

4. The fixed pillar with heat loss as claimed in claim 1, wherein the end of the metal body has a spiral pillar, which has the outer screw thread.

5. The fixed pillar with heat loss as claimed in claim 1, wherein another end of the metal body has an inner screw thread hole.

6. A fixed pillar with heat loss comprising:
    a metal body extending in a longitudinal direction, the metal body being a hollow body and an end of the metal body having an inner screw thread hole; and
    a plurality of grooves respectively being formed within two sides of the metal body for passage of air in a transverse direction, the air in fluid communication with respective grooves formed within the metal body to cool an electrical device attached to at least one end of the metal body.

7. The fixed pillar with heat loss as claimed in claim 6, wherein the metal body is a pillar.

8. The fixed pillar with heat loss as claimed in claim 7, wherein the pillar is a polygon pillar.

9. The fixed pillar with heat loss as claimed in claim 6, wherein another end of the metal body has an inner screw thread hole.

* * * * *